United States Patent
Park et al.

(10) Patent No.: US 10,312,469 B2
(45) Date of Patent: Jun. 4, 2019

(54) DISPLAY DEVICE

(71) Applicant: Samsung Display Co., Ltd., Yongin-si, Gyeonggi-do (KR)

(72) Inventors: Hyunae Park, Yongin-si (KR); Wonkyu Kwak, Yongin-si (KR); Jieun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/863,745

(22) Filed: Jan. 5, 2018

(65) Prior Publication Data

US 2019/0044092 A1 Feb. 7, 2019

(30) Foreign Application Priority Data

Aug. 1, 2017 (KR) .................. 10-2017-0097813

(51) Int. Cl.
*H01L 29/08* (2006.01)
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3258* (2013.01)

(58) Field of Classification Search
CPC ........... H01L 27/1463; H01L 27/14612; H01L 27/14636; H01L 27/14627
See application file for complete search history.

(56) References Cited

U.S. PATENT DOCUMENTS

| 8,148,724 B2 | 4/2012 | Lee et al. |
| 2006/0152663 A1 | 7/2006 | Kamoshida et al. |
| 2014/0183470 A1* | 7/2014 | Kim .................. H01L 51/5253 257/40 |
| 2017/0070507 A1 | 3/2017 | Leconte et al. |

FOREIGN PATENT DOCUMENTS

| JP | 2006-195075 A | 7/2006 |
| KR | 10-2010-0059508 A | 6/2010 |
| KR | 10-2010-0125502 A | 12/2010 |

* cited by examiner

*Primary Examiner* — Selim U Ahmed
*Assistant Examiner* — Andre Stevenson
(74) *Attorney, Agent, or Firm* — Lewis Roca Rothgerber Christie LLP

(57) ABSTRACT

A display device includes: a substrate including a display area and a non-display area outside the display area; a display unit arranged in the display area of the substrate; an inorganic insulating film arranged on the substrate over the display area and the non-display area; a first organic insulating film arranged on the inorganic insulating film and having a first opening extending in a first direction so as to correspond to at least a portion of the non-display area, a planar shape of an end of the first opening having a concavo-convex shape; and an encapsulation unit arranged on the display unit to cover the display unit.

20 Claims, 11 Drawing Sheets

DISPLAY DEVICE

CROSS-REFERENCE TO RELATED APPLICATION

This application claims priority to and the benefit of Korean Patent Application No. 10-2017-0097813, filed on Aug. 1, 2017 in the Korean Intellectual Property Office, the entire disclosure of which is incorporated herein by reference.

BACKGROUND

1. Field

Aspects of one or more embodiments relate to a display device.

2. Description of the Related Art

Generally, a display device has a display unit located on a substrate. By bending a part of such a display device, it is possible to improve the visibility at various angles or reduce the area of a non-display area.

However, in the case of a conventional display device, defects occur in a process of manufacturing such a bent display device, or the life of a display device is reduced.

SUMMARY

According to an aspect of one or more embodiments, a display device is capable of ensuring a long life and minimizing or reducing the occurrence of defects, such as disconnection during a manufacturing process. However, this aspect is merely an example, and embodiments of the present disclosure are not limited thereto.

Additional aspects will be set forth, in part, in the description which follows and, in part, will be apparent from the description, or may be learned by practice of the presented example embodiments.

According to one or more example embodiments, a display device includes: a substrate including a display area and a non-display area outside the display area; a display unit arranged in the display area of the substrate; an inorganic insulating film arranged on the substrate over the display area and the non-display area; a first organic insulating film arranged on the inorganic insulating film and having a first opening extending in a first direction so as to correspond to at least a portion of the non-display area, wherein a planar shape of an end of the first opening has a concavo-convex shape; and an encapsulation unit arranged on the display unit to cover the display unit.

The first opening may have a first end adjacent to the display area and extend in the first direction and a second end facing the first end, wherein a planar shape of the second end has the concavo-convex shape.

The second end may have a protruding portion and a recess portion arranged alternately and continuously, wherein the protruding portion or the recess portion is protruded or recessed in a second direction crossing the first direction.

A distance from the protruding portion to the first end may be less than a distance from the recess portion to the first end.

The encapsulation unit may cover the first end of the first opening.

The first opening may expose a first area of the inorganic insulating film, and the encapsulation unit may directly contact at least a portion of the first area.

The display device may further include a second organic insulating film arranged on the first organic insulating film and having a second opening corresponding to the first opening, wherein a shape of an end of the second opening corresponding to a second end of the first organic insulating film defining the second end of the first opening follows a shape of the second end of the first organic insulating film.

The second organic insulating film may cover the second end of the first organic insulating film.

The display device may further include a third organic insulating film arranged on the second organic insulating film and having a third opening corresponding to the second opening, wherein a shape of an end of the third opening corresponding to the second end of the first organic insulating film follows the shape of the second end of the first organic insulating film.

An end of the third organic insulating film may coincide with an end of the second organic insulating film.

A width of the third opening of the third organic insulating film may be greater than a width of the first opening of the first organic insulating film.

The display device may further include a fourth organic insulating film between the first organic insulating film and the second organic insulating film and having a fourth opening corresponding to the first opening.

An end of the fourth organic insulating film may coincide with the second end of the first organic insulating film.

The second organic insulating film may cover the second end of the first organic insulating film and an end of the fourth organic insulating film.

An end of the third organic insulating film may coincide with an end of the second organic insulating film.

A width of the third opening of the third organic insulating film may be greater than a width of the first opening of the first organic insulating film.

The display unit may include a thin-film transistor and a pixel electrode electrically connected to the thin-film transistor, and the first organic insulating film may cover the thin-film transistor and may be between the thin-film transistor and the pixel electrode.

The second organic insulating film may cover an edge of the pixel electrode to define a pixel area.

A slope of the second end may be gentler than a slope of the first end.

According to one or more example embodiments, a display device includes: a substrate including a display area and a non-display area outside the display area; an inorganic insulating unit including at least one inorganic insulating film arranged on the substrate over the display area and the non-display area; and an organic insulating unit arranged on the inorganic insulating unit and including at least one organic insulating film, and having an opening extending in a first direction so as to correspond to at least a portion of the non-display area, wherein the opening has a first end adjacent to the display area and extending in the first direction and a second end facing the first end, wherein the second end has a protruding portion and a recess portion arranged alternately and continuously in a second direction intersecting the first direction.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
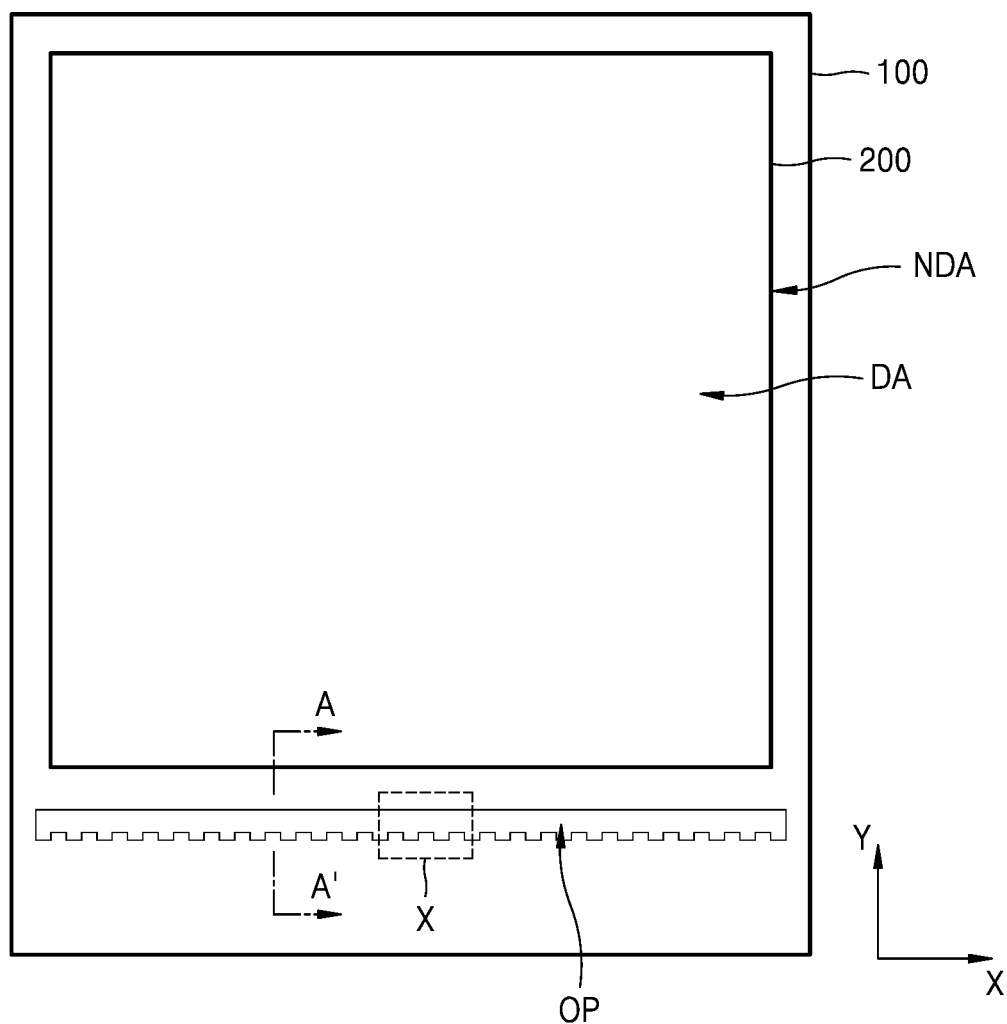
FIG. 1 is a plan view of a display device according to an example embodiment.

As the present disclosure allows for various changes and numerous embodiments, some example embodiments will be illustrated in the drawings and described in further detail in the written description. An effect and a characteristic of the present disclosure, and a method of accomplishing these will be apparent when referring to embodiments described with reference to the drawings. The present disclosure may, however, be embodied in many different forms and should not be construed as limited to the example embodiments set forth herein.

Reference will now be made in further detail to some example embodiments, examples of which are illustrated in the accompanying drawings, wherein like reference numerals refer to like elements throughout, and repeated description thereof will be omitted.

It will be understood that although the terms "first," "second," etc. may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be understood that terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

The x-axis, the y-axis, and the z-axis are not limited to three axes of the rectangular coordinate system, but may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
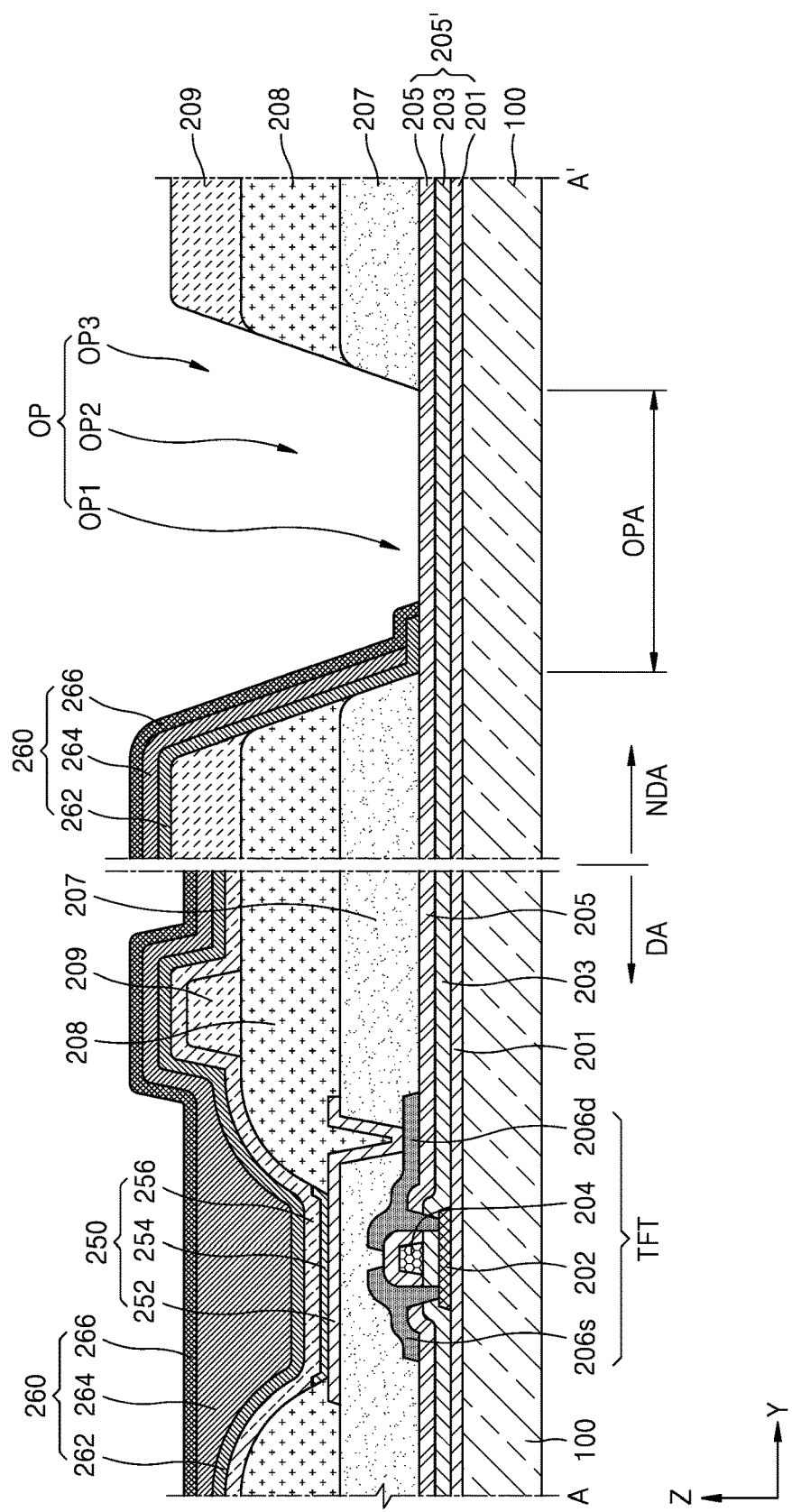
FIG. 2 is a cross-sectional view of the display device of FIG. 1, taken along a line A-A'.

FIG. 1 is a plan view of a display device according to an example embodiment; and FIG. 2 is a cross-sectional view of the display device of FIG. 1, taken along a line A-A'.

Referring to FIGS. 1 and 2, a display device according to an example embodiment includes a substrate 100 including a display area DA and a non-display area NDA outside the display area DA, a display unit 200 arranged in the display area DA of the substrate 100, an inorganic insulating film 205' arranged on the substrate 100, a first organic insulating film 207 arranged on the inorganic insulating film 205' and having an opening OP corresponding to at least a portion of the non-display area NDA, and an encapsulation unit 260 arranged on the display unit 200.

The substrate 100 may include any of a variety of flexible or bendable materials, for example, a polymer resin, such as polyethersulfone (PES), polyacrylate (PAR), polyetherimide (PEI), polyethylene (PEN), polyethylene terephthalate (PET), polyphenylene sulfide (PPS), polyarylate (PAR), polyimide (PI), polycarbonate (PC), or cellulose acetate propionate (CAP). In another example embodiment, the substrate 100 may include a metal material or a glass material.

The substrate 100 may include the display area DA and the non-display area NDA outside the display area DA. In the present example embodiment, the display area DA is at the center of the substrate 100, and the non-display area NDA is arranged so as to surround the display area DA. However, in another example embodiment, such as in an example embodiment with a very thin bezel, the non-display area NDA may be arranged to surround a portion of the display area DA.

The display unit 200 may be arranged on the display area DA of the substrate 100. The display unit 200 may be understood as an area where a plurality of pixels emits light and an image is externally displayed.

In the display device according to the present example embodiment, the first organic insulating film 207 may be arranged on the substrate 100. The first organic insulating film 207 may be arranged on at least a portion of the display area DA and the non-display area NDA. It can be understood that the first organic insulating film 207 corresponds to a via layer to be described later herein.

The first organic insulating film 207 may have a first opening OP1 (see FIG. 2) located in the non-display area NDA, and the opening OP may include the first opening OP1. Referring to FIG. 1, the opening OP may be at one side of the display unit 200, and, in an embodiment, the non-display area NDA including the opening OP may include a fan-out wiring (not shown).

The opening OP may extend in a first direction (+X direction) along a contour of the display unit 200, and one end of the opening OP extending in the first direction (+X direction) may have a concavo-convex shape. Here, one end having a concave and convex shape may mean that one end in a first plane (X-Y plane) has a concavo-convex shape as shown in FIG. 1.

FIG. 2 shows the display unit 200 arranged in the display area DA. Although the display unit 200 according to the present example embodiment includes an organic light-emitting diode (OLED) 250, other example embodiments may include a liquid crystal diode or an inorganic light-emitting diode (ILED).

The inorganic insulating film 205', which includes a monolayer or a multilayer, may be arranged on the substrate 100. The inorganic insulating film 205' may include a buffer layer 201, a gate insulating film 203, and an interlayer insulating film 205, which will be described later herein.

First, in order to planarize a surface of the substrate 100 or to prevent or substantially prevent impurities or the like from penetrating into a semiconductor layer 202 of a thin-film transistor TFT, the buffer layer 201 is arranged on the substrate 100, and the semiconductor layer 202 may be located on the buffer layer 201, the buffer layer 201 including silicon oxide, silicon nitride, or the like.

A gate electrode 204 is arranged on the semiconductor layer 202. A source electrode 206s and a drain electrode 206d are electrically connected to each other in accordance with a signal applied to the gate electrode 204. The gate electrode 204 may include a monolayer or a multilayer of a material such as aluminum (Al), platinum (Pt), palladium (Pd), silver (Ag), gold (Au), nickel (Ni), neodymium (Nd), chromium (Cr), lithium (Li), calcium (Ca), molybdenum (Mo), titanium (Ti), tungsten (W), copper (Cu), or the like, in consideration of adhesion with an adjacent layer, surface flatness of a layer to be stacked, and workability.

Here, the gate insulating film 203 made of silicon oxide and/or silicon nitride may be formed between the semiconductor layer 202 and the gate electrode 204 in order to provide insulation between the semiconductor layer 202 and the gate electrode 204.

The interlayer insulating film 205 may be arranged on the gate electrode 204. The interlayer insulating film 205 may include a monolayer or a multilayer of a material such as silicon oxide or silicon nitride.

The source electrode 206s and the drain electrode 206d are formed on the interlayer insulating film 205. The source electrode 206s and the drain electrode 206d are electrically connected to the semiconductor layer 202 through a contact hole formed in the interlayer insulating film 205 and the gate insulating film 203, respectively. The source electrode 206s and the drain electrode 206d may include a monolayer or a multilayer of at least one of Al, Pt, Pd, Ag, Au, Ni, Nd, Cr, Li, Ca, Mo, Ti, W, Cu, or the like, in consideration of conductivity and the like.

Although not shown in FIG. 2, a protective film (not shown) for covering the thin-film transistor TFT may be arranged to protect the thin-film transistor TFT having such a structure. The protective film may be formed of an inorganic material such as silicon oxide, silicon nitride, or silicon oxynitride.

In an embodiment, the buffer layer 201, the gate insulating film 203, and the interlayer insulating film 205 may be formed on the entire surface of the flexible substrate 100.

The first organic insulating film 207 may be arranged on the substrate 100. The first organic insulating film 207 substantially flattens an upper surface of the thin-film transistor TFT and protects the thin-film transistor TFT and various devices when the OLED 250 is arranged on the thin-film transistor TFT. The first organic insulating film 207 may be formed of, for example, acrylic organic material or benzocyclobutene (BCB).

A second organic insulating film 208 may be arranged above the thin-film transistor TFT. The second organic insulating film 208 may be located on the first organic insulating film 207 described above and may have the opening OP. The second organic insulating film 208 defines a pixel area on the substrate 100.

The second organic insulating film 208 may be formed of, for example, an organic insulating film. Examples of such an organic insulating film may include an acrylic polymer, such as polymethylmethacrylate (PMMA), polystyrene (PS), a polymer derivative including a phenol group, an imide polymer, an aryl ether polymer, an amide polymer, a fluorine polymer, a p-xylene polymer, a vinyl alcohol polymer, or a mixture thereof.

A third organic insulating film 209 may be arranged on the second organic insulating film 208. The third organic insulating film 209 may function as a spacer. In an embodiment, the third organic insulating film 209 may be provided only on a portion of the second organic insulating film 208. In the present example embodiment according to FIG. 2, the third organic insulating film 209 is arranged on the second organic insulating film 208; however, in one or more other embodiments, the third organic insulating film 209 may not be provided.

In one or more embodiments, the OLED 250 may be arranged on the first organic insulating film 207. The OLED 250 may include a pixel electrode 252, an intermediate layer 254 including an emission layer (EML), and an opposite electrode 256.

The pixel electrode 252 may include a semi-transparent electrode or a reflective electrode. When the pixel electrode 252 includes a semi-transparent electrode, the pixel electrode 252 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 252 includes a reflective electrode, the pixel electrode 252 may include, for example, a reflective layer formed of Ag, magnesium (Mg), Al, Pt, Pd, Au, Ni, Nd, iridium (Ir), Cr, or a compound thereof, and a layer formed of ITO, IZO, ZnO, $In_2O_3$, IGO, or AZO. However, the present disclosure is not limited thereto, and any of various modifications may be made. The pixel electrode 252 may be formed of any of various materials, and may have a monolayer or a multilayer structure.

The intermediate layer 254 may be arranged in each pixel area defined by the second organic insulating film 208. The intermediate layer 254 includes the EML that emits light according to an electrical signal. In the intermediate layer 254, as well as the EML, a hole injection layer (HIL) arranged between the EML and the pixel electrode 252, a hole transport layer (HTL), an electron transport layer (ETL) arranged between the EML and the opposite electrode 256, an electron injection layer (EIL) or the like may be stacked in a single or composite structure. However, the intermediate layer 254 is not limited thereto, and may have any of various structures.

In an embodiment, the opposite electrode 256 covering the intermediate layer 254 including the EML and facing the pixel electrode 252 may be arranged over the entire surface of the substrate 100. The opposite electrode 256 may include a semi-transparent electrode or a reflective electrode.

When the opposite electrode 256 includes a semi-transparent electrode, the opposite electrode 256 may include a layer formed of a metal having a small work function, for example, Li, Ca, lithium fluoride (LiF)/Ca, LiF/Al, Al, Ag, Mg, or a compound thereof, and a semi-transparent conductive layer, such as ITO, IZO, ZnO, or $In_2O_3$. When the opposite electrode 256 includes a reflective electrode, the opposite electrode 256 may include a layer formed of Li, Ca, LiF/Ca, LiF/Al, Al, Ag, Mg, or a compound thereof. However, structures and materials of the opposite electrode 256 are not limited thereto and may be varied.

In one or more example embodiments, functional layers such as the encapsulation unit 260, a polarizing layer (not shown), and a color filter (not shown) may be further arranged on the opposite electrode 256.

Since the OLED 250 may be easily damaged by moisture or oxygen from the outside, the encapsulation unit 260 may cover and protect the OLED 250. The encapsulation unit 260 may cover the display area DA and extend to the outside of the display area DA. In an embodiment, the encapsulation unit 260 may include a first inorganic encapsulation layer 262, an organic encapsulation layer 264, and a second inorganic encapsulation layer 266, as shown in FIG. 2.

The first inorganic encapsulation layer 262 covers the opposite electrode 256 and may include silicon oxide, silicon nitride, and/or silicon oxynitride. In one or more embodiments, other layers such as a capping layer may be between the first inorganic encapsulation layer 262 and the opposite electrode 256. Since the first inorganic encapsulation layer 262 is formed along the lower structure, an upper surface of the first inorganic encapsulation layer 262 is not flat, as shown in FIG. 2. The organic encapsulation layer 264 covers the first inorganic encapsulation layer 262. However, unlike the first inorganic encapsulation layer 262, an upper surface of the organic encapsulation layer 264 may be formed to be generally flat. In more detail, the upper surface of the organic encapsulation layer 264 corresponding to the display area DA may be approximately flat. The organic encapsulation layer 264 may include at least one selected from the group consisting of PET, PEN, PC, PI, PES, polyoxymethylene (POM), PAR, and hexamethyldisiloxane (HMDSO). The second inorganic encapsulation layer 266 covers the organic encapsulation layer 264 and may include silicon dioxide ($SiO_2$), silicon nitride film (SiNx), and/or silicon oxynitride (SiON). The second inorganic encapsulation layer 266 may prevent or substantially prevent the organic encapsulation layer 264 from being exposed to the outside because the second inorganic encapsulation layer 266 contacts the edge of the first inorganic encapsulation layer 262 located outside the display area DA.

In this manner, since the encapsulation unit 260 has a multilayer structure including the first inorganic encapsulation layer 262, the organic encapsulation layer 264, and the second inorganic encapsulation layer 266, even if a crack occurs in the encapsulation unit 260, the crack may not be connected between the first inorganic encapsulation layer 262 and the organic encapsulation layer 264, or between the organic encapsulation layer 264 and the second inorganic encapsulation layer 266 through the multilayer structure. In this manner, the formation of a penetration path of external moisture or oxygen into the display area DA may be prevented or minimized.

In one or more embodiments, the first organic insulating film 207, the second organic insulating film 208, and the third organic insulating film 209 may extend partially to the non-display area NDA.

In the present example embodiment, the non-display area NDA may have the opening OP including the first opening OP1, a second opening OP2, and a third opening OP3. The first organic insulating film 207 may include the first opening OP1. Furthermore, the second organic insulating film 208 may have the second opening OP2 corresponding to the first opening OP1, and the third organic insulating film 209 may have the third opening OP3 corresponding to the second opening OP2.

The encapsulation unit 260 may be arranged to cover the OLED 250 as described above, or may extend to the non-display area NDA. The encapsulation unit 260 may be arranged to extend to the first opening OP1, the second opening OP2, and the third opening OP3 and may cover one end of the first opening OP1, the second opening OP2, and the third opening OP3 adjacent to the display unit 200. Meanwhile, the first opening OP1 may expose a first area OPA of the inorganic insulating film 205', and the encapsulation unit 260 covering the end of the first opening OP1, the second opening OP2, and the third opening OP3 may be provided to be in direct contact with at least a portion of the first area OPA.

Figure 3:
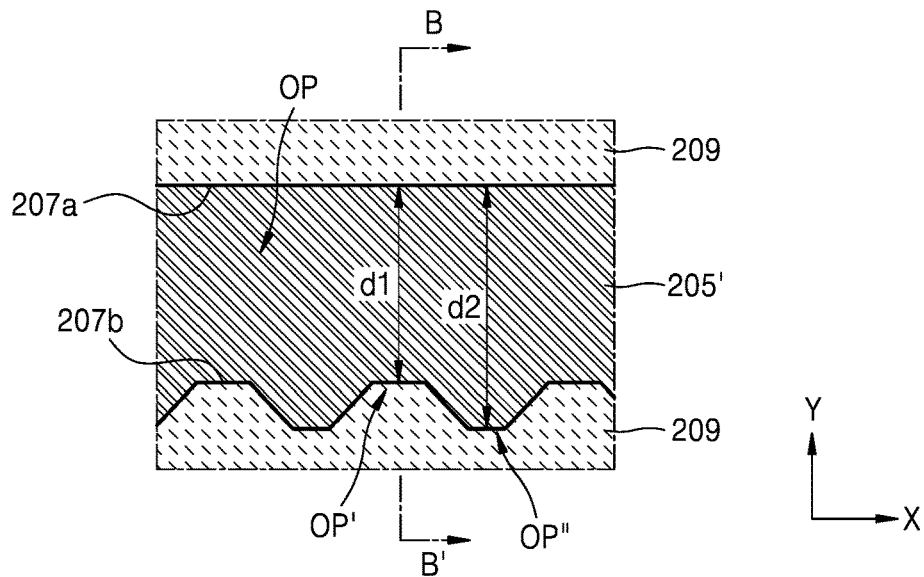
FIG. 3 is an enlarged plan view of a region "X" of the display device of FIG. 1.
Figure 4:
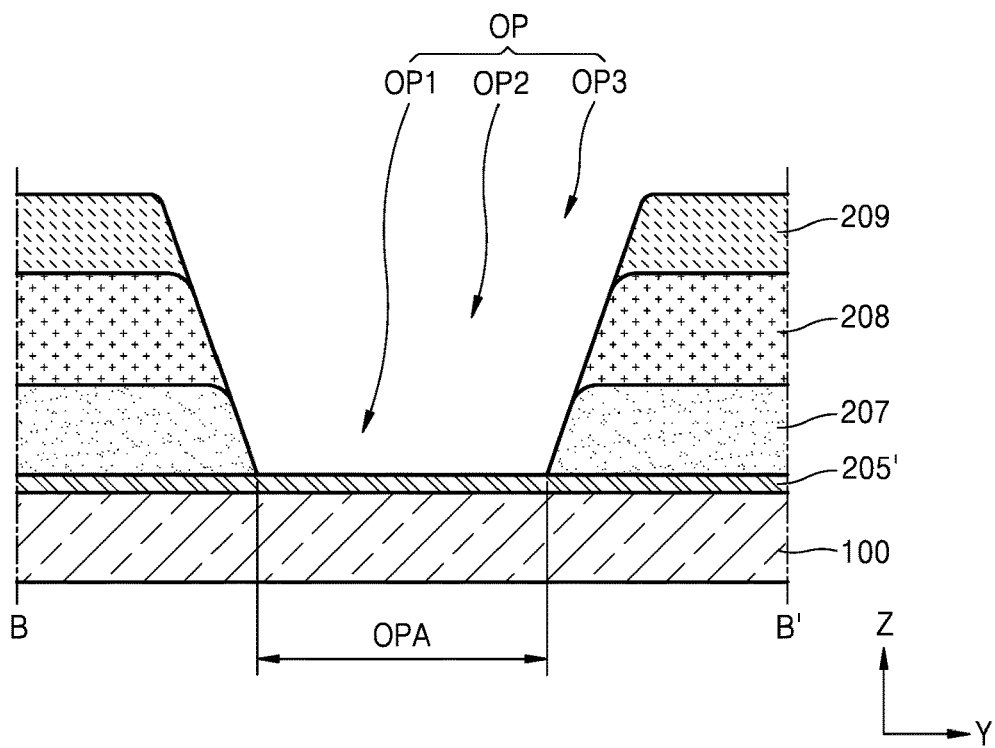
FIG. 4 is a cross-sectional view of the display device of FIG. 3, taken along a line B-B'.

FIG. 3 is an enlarged plan view of a region "X" of the display device of FIG. 1; and FIG. 4 is a cross-sectional view of the display device of FIG. 3, taken along a line B-B'.

Referring to FIGS. 3 and 4, the display device according to the present example embodiment may include the inorganic insulating film 205' arranged over the display area DA and the non-display area NDA on the substrate 100, and the first organic insulating film 207 arranged on the inorganic insulating film 205' and having the first opening OP1. Furthermore, the second organic insulating film 208 having the second opening OP2 corresponding to the first opening OP1, and the third organic insulating film 209 having the third opening OP3 may further be arranged on the first organic insulating film 207.

The first opening OP1 may be formed to extend in the first direction (+X direction), and one end of the first opening OP1 extending in the first direction (+X direction) may have a concavo-convex shape. Such a concavo-convex shape may be understood as a shape appearing on the first plane (x-y plane) as shown in FIG. 3.

The first opening OP1 may include a first end 207a extending in the first direction (+X direction) and a second end 207b facing the first end 207a. The first end 207a may be a portion adjacent to the display area DA. In the present example embodiment, a planar shape of the second end 207b may be provided in a concavo-convex shape. That is, the first end 207a adjacent to the display area DA may be linearly formed without a separate pattern, but a surface of the second end 207b facing the first end 207a may have a concavo-convex shape.

As described above, the concavo-convex shape of the second end 207b of the first opening OP1 may include a protruding portion OP' and a recess portion OP''' arranged alternately and continuously. The protruding portion OP' and the recess portion OP''' may be protruded or recessed in a second direction (+Y direction) intersecting or crossing the first direction (+X direction). Therefore, a distance d1 from the protruding portion OP' of the second end 207b to the first end 207a may be less than a distance d2 from the recess portion OP''' of the second end 207b to the first end 207a. Referring to FIG. 3, the concavo-convex shape of the second end 207b, that is, the protruding portion OP' and the recess portion OP''' of the second end 207b, may have a gentle slope in a trapezoidal shape. However, the present disclosure is not limited thereto.

Referring to FIG. 4, in the present example embodiment, the second organic insulating film 208 and the third organic insulating film 209 may be arranged on the first organic insulating film 207. The second organic insulating film 208 and the third organic insulating film 209 may have the second opening OP2 and the third opening OP3 corresponding to the first opening OP1, respectively. In an embodiment, an end of the first opening OP1 and ends of the second opening OP2 and the third opening OP3 may coincide with each other. That the ends coincide with each other may mean that the second organic insulating film 208 and/or the third organic insulating film 209 arranged on the first organic insulating film 207 are provided so as not to cover the end of the first opening OP1.

In the example embodiment in which ends of openings OP coincide with each other, a shape of one end of the second opening OP2 corresponding to the second end 207b of the first organic insulating film 207 may be provided along a shape of the second end 207b. Similarly, a shape of one end of the third opening OP3 corresponding to the second end 207b of the first organic insulating film 207 may be provided along the shape of the second end 207b. That is, since the shape of the second end 207b of the first opening OP1 is a concave-convex shape, the second opening OP2 and the third opening OP3 arranged on the first organic insulating film 207 and corresponding to the first opening OP1 may also be provided in a concavo-convex shape.

Referring to FIG. 3, in the present example embodiment, a planar shape of the second end 207b of the first opening OP1 has a concavo-convex structure, and a planar shape of the first end 207a of the first opening OP1 may be formed in a simple linear shape instead of the concavo-convex structure. However, although not shown, in another example embodiment, a planar shape of the first end 207a of the first opening OP1 may also be formed in a concavo-convex structure like the second end 207b of the first opening OP1.

As described above, in a display device, the first organic insulating film 207 arranged on the substrate 100 has the first opening OP1 extending in the first direction (+X direction) in the non-display area NDA. The encapsulation unit 260 covers one end of the first opening OP1 to protect the display unit 200 from external moisture. In this case, cracks are generated in the inorganic insulating film 205' under the first organic insulating film 207 due to stress in the non-display area NDA in a periphery of the first opening OP1, which may cause defects, such as corrosion of a data wiring located in the first opening OP1 and the periphery of the first opening OP1. Further, the stress at the periphery of the first opening OP1 is highly likely to be concentrated due to a step at one end of the first opening OP1. Cracks of the inorganic insulating film 205' are generated substantially at the corresponding portion, and a defective rate in the data wiring is increased.

In a display device according to an example embodiment, a planar shape of one end of the first opening OP1 of the first organic insulating film 207 is provided in a concavo-convex shape to disperse stress concentrated due to a step at one end of the first opening OP1. Accordingly, cracks may be prevented or substantially prevented from being generated in the inorganic insulating film 205' under the first organic insulating film 207 in the corresponding portion, and a display device with improved reliability may be realized.

Figure 5:
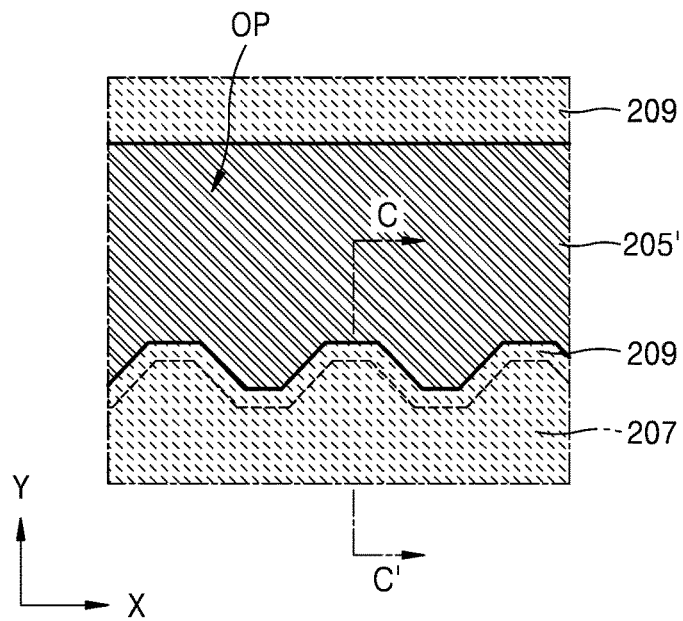
FIG. 5 is a plan view of a portion of a display device according to another example embodiment.
Figure 6:
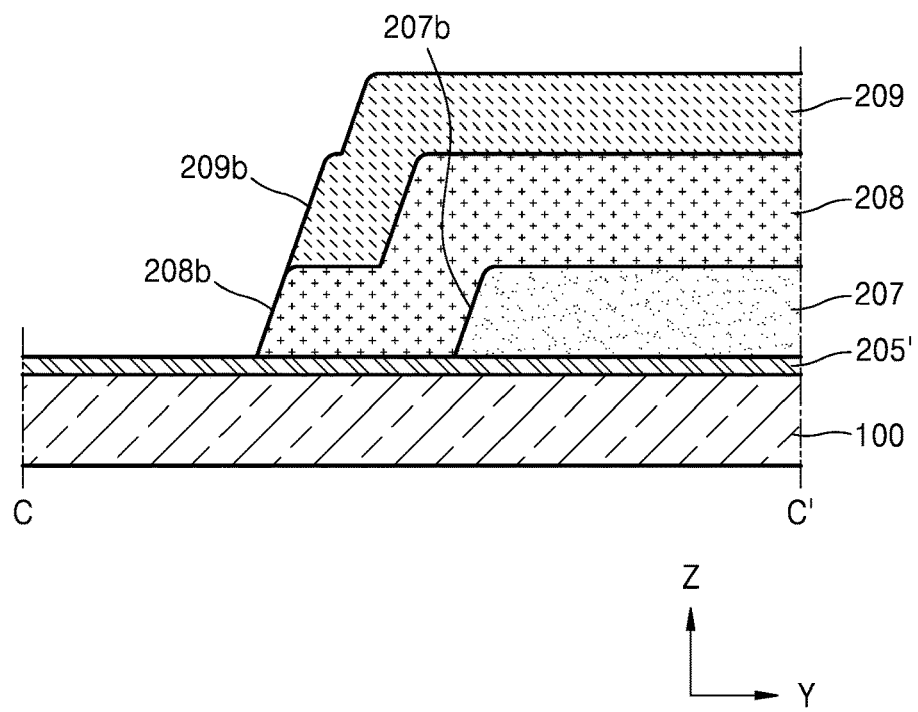
FIG. 6 is a cross-sectional view of the display device of FIG. 5, taken along a line C-C'.

FIG. 5 is a plan view of a portion of a display device according to another example embodiment; and FIG. 6 is a cross-sectional view of the display device of FIG. 5, taken along a line C-C'.

Example embodiments of FIGS. 5 and 6 are generally similar to those of FIGS. 3 and 4 described above. However, there are some differences in a shape of the cross-section according to an arrangement of the second organic insulating film 208 and the third organic insulating film 209, as shown in FIG. 6. FIGS. 5 and 6 are described with reference to the above-described example embodiments, and repeated descriptions thereof are omitted for convenience of description.

Referring to FIGS. 5 and 6, in the display device according to the present example embodiment, the second organic insulating film 208 may be provided to cover the second end 207b of the first organic insulating film 207, where the second end 207b of the first organic insulating film 207 refers to an end defining the second end 207b of the first opening OP1. Therefore, the second organic insulating film 208 covers the second end 207b of the first organic insulating film 207, and may contact a portion of the inorganic insulating film 205'.

In addition, the third organic insulating film 209 may be arranged on the second organic insulating film 208. In an embodiment, one end 208b of the second organic insulating film 208 and one end 209b of the third organic insulating film 209, which correspond to the second end 207b of the first organic insulating film 207, may coincide with each other. That the one end 208b of the second organic insulating film 208 and the one end 209b of the third organic insulating film 209 coincide with each other can be understood that the third organic insulating film 209 is provided so as not to cover the one end 208b of the second organic insulating film 208.

Since the second organic insulating film 208 arranged on the first organic insulating film 207 covers the second end 207b of the first organic insulating film 207 as described above, pressure concentrated on the second end 207b may be dispersed. That is, an effect of moderating a slope of a stepped portion of the opening OP through a stepwise step as shown in FIG. 6 may be provided, thereby realizing a pressure dispersion effect of the stepped portion.

Figure 7:
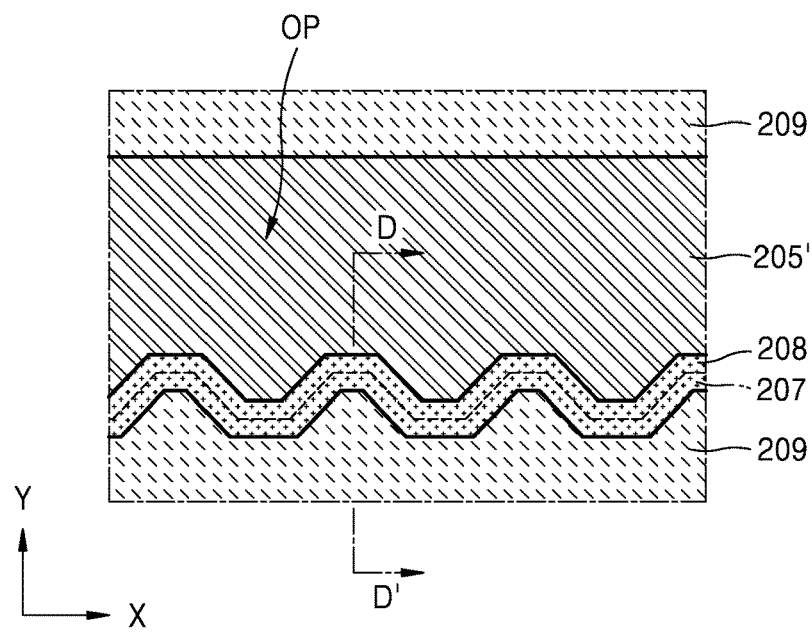
FIG. 7 is a plan view of a portion of a display device according to another example embodiment.
Figure 8:
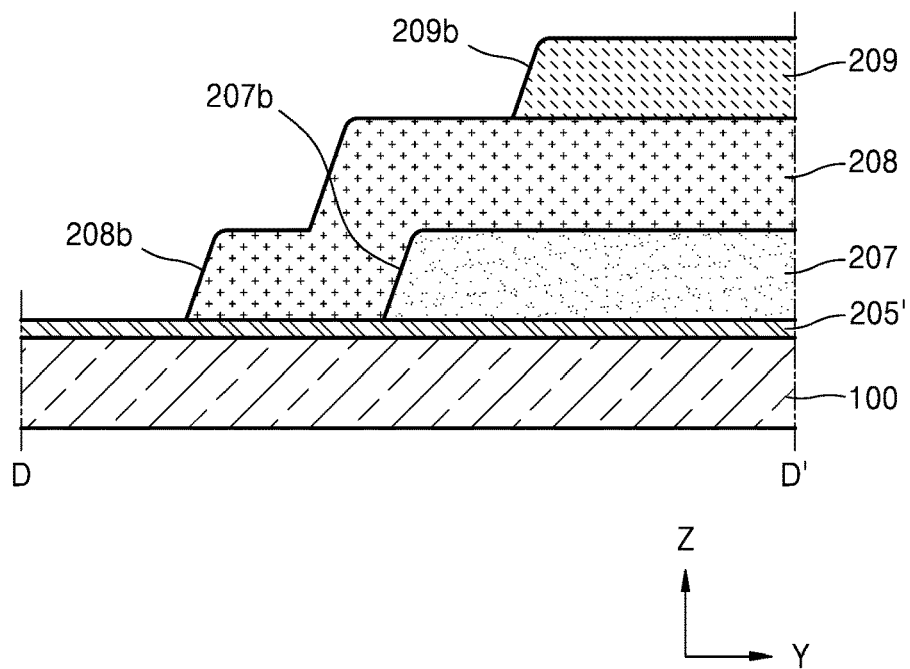
FIG. 8 is a cross-sectional view of the display device of FIG. 7, taken along a line D-D'.

FIG. 7 is a plan view of a portion of a display device according to another example embodiment; and FIG. 8 is a cross-sectional view of the display device of FIG. 7, taken along a line D-D'.

Example embodiments of FIGS. 7 and 8 are generally similar to those of FIGS. 5 and 6 described above. However, there are some differences in a shape of the cross-section according to an arrangement of the third organic insulating film 209 as shown in FIG. 8. FIGS. 7 and 8 are described with reference to the above-described example embodiments, and repeated descriptions thereof are omitted for convenience of description.

Referring to FIGS. 7 and 8, in the display device according to the present example embodiment, the second organic insulating film 208 may be provided to cover the second end 207b of the first organic insulating film 207. Therefore, the second organic insulating film 208 covers the second end 207b of the first organic insulating film 207, and may contact a portion of the inorganic insulating film 205'.

In addition, the third organic insulating film 209 may be arranged on the second organic insulating film 208. Here, the one end 208b of the second organic insulating film 208 and the one end 209b of the third organic insulating film 209, which correspond to the second end 207b of the first organic insulating film 207, may not coincide with each other. That is, as shown in FIG. 8, the third organic insulating film 209 may be arranged only on the second organic insulating film 208. Therefore, only the second organic insulating film 208 covers the second end 207b of the first organic insulating film 207, and the third organic insulating film 209 may not cover the one end 208b of the second organic insulating film 208. A width w2 of the third opening OP3 of the third organic insulating film 209 may be greater than a width w1 of the first opening OP1 of the first organic insulating film 207.

In the display device according to the present example embodiment, a stepwise structure of a stepped portion of the opening OP may be more clearly realized as compared with the example embodiments shown in FIGS. 5 and 6 described above. That is, as the third organic insulating film 209 is formed more inward than the second end 207b, the stepped portion of the opening OP may have a more gentle slope. An effect of moderating a slope of a stepped portion of the opening OP through such a stepwise step may be provided, thereby realizing a pressure dispersion effect of the stepped portion.

Figure 9:
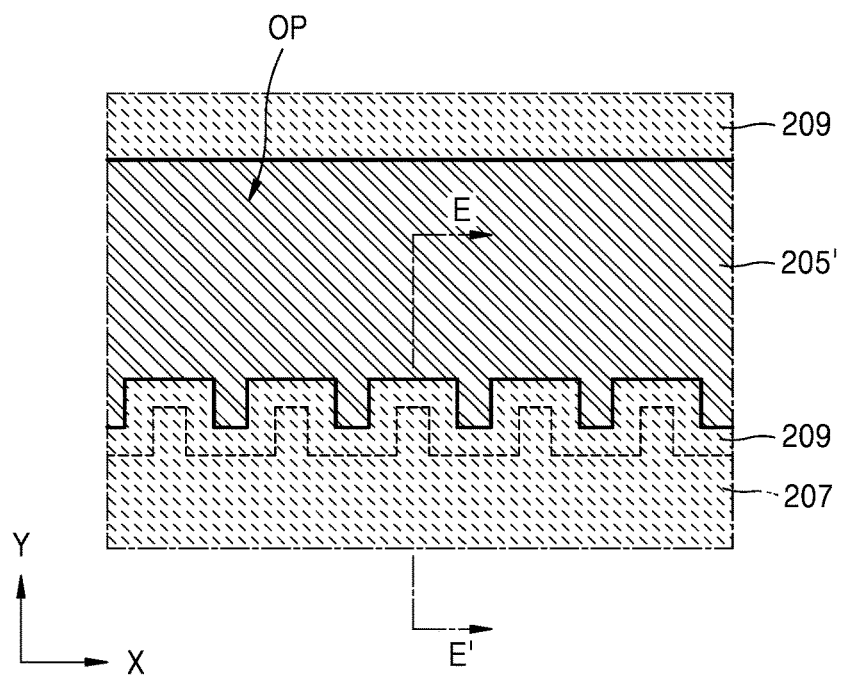
FIG. 9 is a plan view of a portion of a display device according to another example embodiment.
Figure 10:
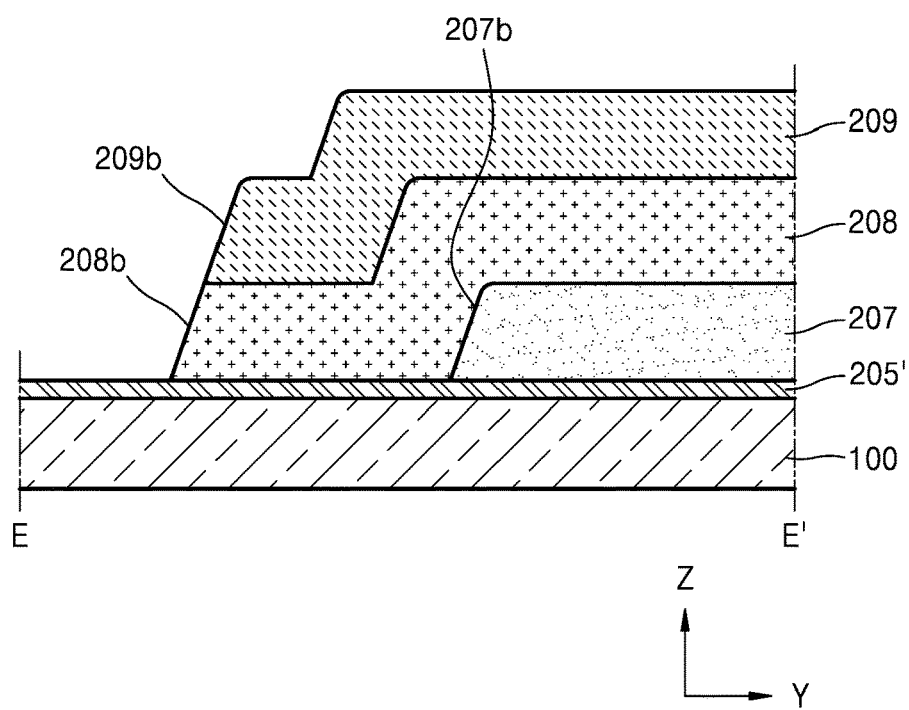
FIG. 10 is a cross-sectional view of the display device of FIG. 9, taken along a line E-E'.

FIG. 9 is a plan view of a portion of a display device according to another example embodiment; and FIG. 10 is a cross-sectional view of the display device of FIG. 9, taken along a line E-E'.

Example embodiments of FIGS. 9 and 10 are generally similar to those of FIGS. 5 and 6 described above. However, there are some differences in a planar shape as shown in FIG. 9. FIGS. 9 and 10 are described with reference to the above-described example embodiments, and repeated descriptions thereof are omitted for convenience of description.

Referring to FIGS. 9 and 10, in the display device according to the present example embodiment, a planar shape of the second end 207b of the first opening OP1 has a concavo-convex shape, and the concavo-convex shape may have a structure in which corners are formed at a substantially right angle. In the example embodiments of FIGS. 5 and 7 described above, the concavo-convex shape of the second end 207b may be formed in a shape in which a trapezoid is repeated, but the concavo-convex shape of the second end 207b according to the present example embodiment may be formed in a shape in which a rectangle is repeated, as shown in FIG. 9.

The concavo-convex shape of the second end 207b according to the present example embodiment may be the same as that of FIG. 6 except for the concavo-convex shape of the second end 207b of FIG. 9 described above, and the description given above with reference to FIG. 6 also applies.

In the present example embodiment, the second organic insulating film 208 may be provided to cover the second end 207b and contact a portion of the inorganic insulating film 205'. In addition, the third organic insulating film 209 may be arranged on the second organic insulating film 208. Here, the one end 208b of the second organic insulating film 208 and the one end 209b of the third organic insulating film 209, which correspond to the second end 207b of the first organic insulating film 207, may coincide with each other.

Since the second organic insulating film 208 arranged on the first organic insulating film 207 covers the second end 207b of the first organic insulating film 207 as described above, pressure concentrated on the second end 207b may be dispersed. That is, an effect of moderating a slope of a stepped portion of the opening OP through a stepwise step as shown in FIG. 10 may be provided, thereby realizing a pressure dispersion effect of the stepped portion.

Figure 11:
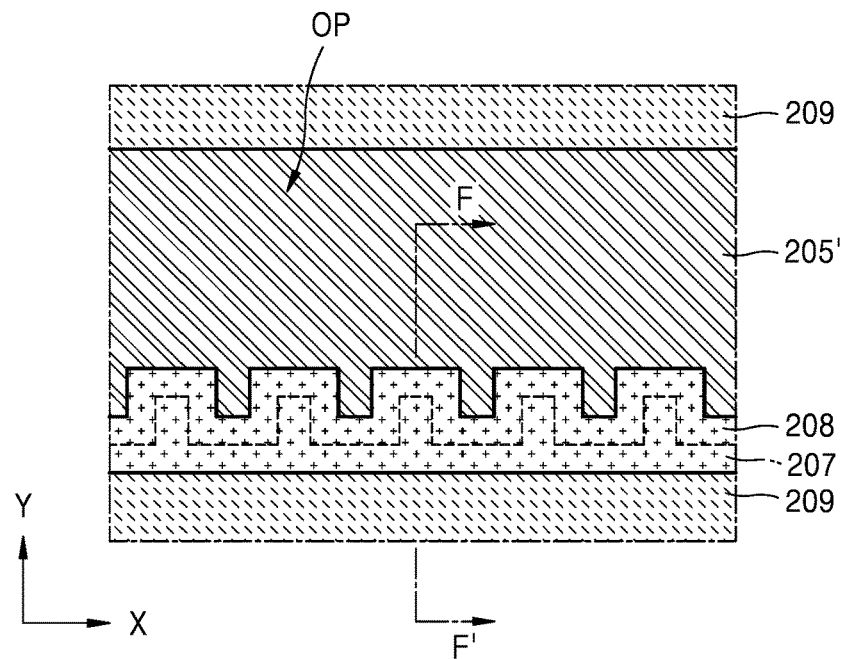
FIG. 11 is a plan view of a portion of a display device according to another example embodiment.
Figure 12:
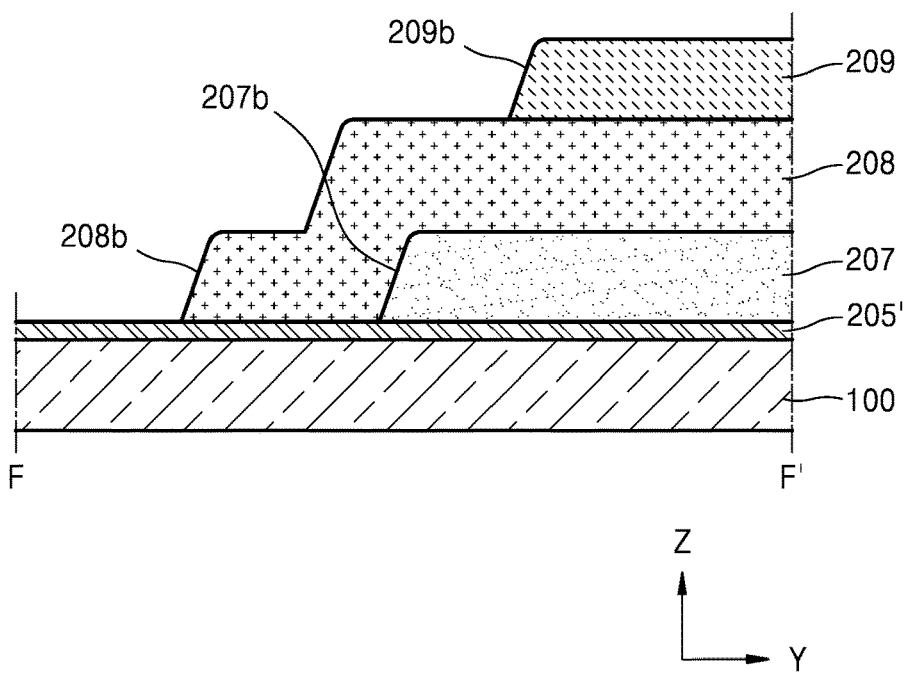
FIG. 12 is a cross-sectional view of the display device of FIG. 11, taken along a line F-F'.

FIG. 11 is a plan view of a portion of a display device according to another example embodiment; and FIG. 12 is a cross-sectional view of the display device of FIG. 11, taken along a line F-F'.

Example embodiments of FIGS. 11 and 12 are generally similar to those of FIGS. 7 and 8 described above. However, there are some differences in a planar shape as shown in FIG. 11. FIGS. 11 and 12 are described with reference to the above-described example embodiments, and repeated descriptions thereof are omitted for convenience of description.

Referring to FIGS. 11 and 12, in the display device according to the present example embodiment, a planar shape of the second end 207b of the first opening OP1 has a concavo-convex shape, and the concavo-convex shape may have a structure in which corners are formed at a substantially right angle. In the example embodiments of FIGS. 5 and 7 described above, the concavo-convex shape of the second end 207b may be formed in a shape in which a trapezoid is repeated, but the concavo-convex shape of the second end 207b according to the present example embodiment may be formed in a shape in which a rectangle is repeated, as shown in FIG. 11.

In the display device according to the present example embodiment, the second organic insulating film 208 may be provided to cover the second end 207b and contact a portion of the inorganic insulating film 205'.

In addition, the third organic insulating film 209 may be arranged on the second organic insulating film 208. Here, the one end 208b of the second organic insulating film 208 and the one end 209b of the third organic insulating film 209, which correspond to the second end 207b of the first organic insulating film 207, may not coincide with each other. That is, as shown in FIG. 12, the third organic insulating film 209 may be arranged only on the second organic insulating film 208. Therefore, only the second organic insulating film 208 covers the second end 207b of the first organic insulating film 207, and the third organic insulating film 209 may not cover the one end 208b of the second organic insulating film 208. The width w2 of the third opening OP3 of the third organic insulating film 209 may be greater than the width w1 of the first opening OP1 of the first organic insulating film 207.

In the display device according to the present example embodiment, a stepwise structure of a stepped portion of the opening OP may be more clearly realized as compared with the example embodiments shown in FIGS. 9 and 10 described above. That is, as the third organic insulating film 209 is formed more inward than the second end 207b, the stepped portion of the opening OP may have a more gentle slope. An effect of moderating a slope of a stepped portion of the opening OP through such a stepwise step may be provided, thereby realizing a pressure dispersion effect of the stepped portion.

Referring to FIG. 11, the one end 209b of the third organic insulating film 209 may be formed in a straight line shape unlike the second end 207b of the first organic insulating film 207 and the one end 208b of the second organic insulating film 208. It can be understood that the straight line shape of the one end 209b of the third organic insulating film 209 may be caused by a width of the concavo-convex shape of the second end 207b due to a design. In another example embodiment, when the width of the concavo-convex shape of the second end 207b is sufficiently secured, the shape of the one end 209b of the third organic insulating film 209 may be provided in a concavo-convex shape like the second end 207b.

Herein, example embodiments of FIGS. 13 to 20 will be described. The example embodiments of FIGS. 13 to 20 described below are generally similar to the example embodiments of FIGS. 5 to 12 described above except that a fourth organic insulating film 210 is further arranged between the first organic insulating film 207 and the second organic insulating film 208. FIGS. 13 to 20 are described with reference to the above-described example embodiments, and repeated descriptions thereof are omitted for convenience of description.

Figure 13:
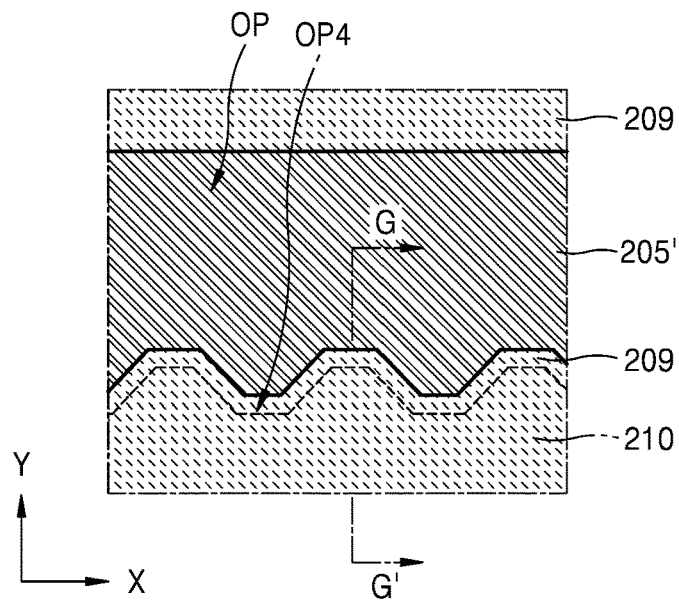
FIG. 13 is a plan view of a portion of a display device according to another example embodiment.
Figure 14:
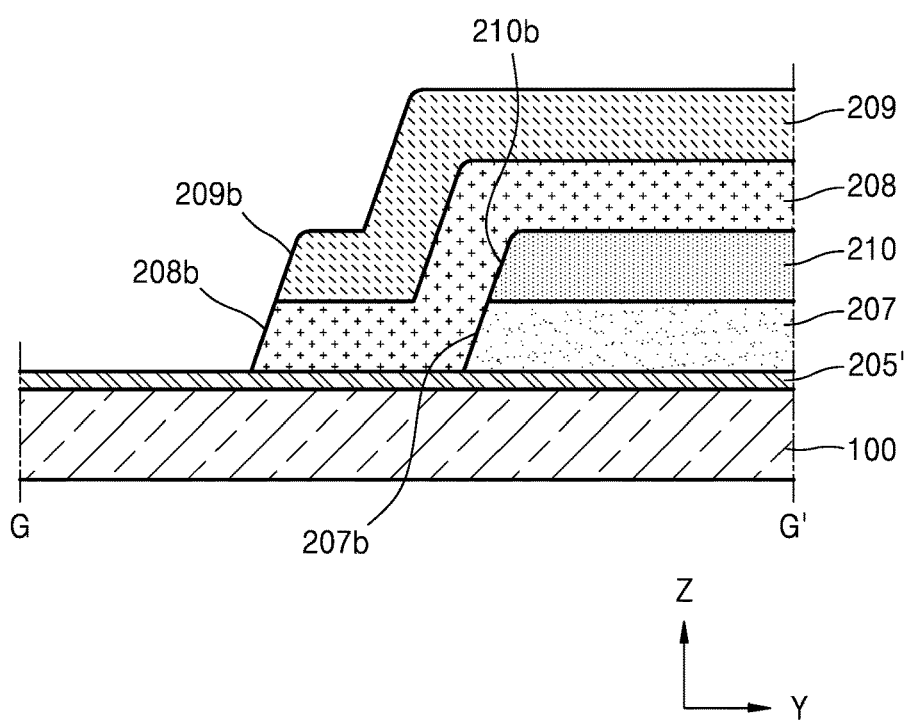
FIG. 14 is a cross-sectional view of the display device of FIG. 13, taken along a line G-G'.

FIG. 13 is a plan view of a portion of a display device according to another example embodiment; and FIG. 14 is a cross-sectional view of the display device of FIG. 13, taken along a line G-G'.

Referring to FIGS. 13 and 14, the display device according to the present example embodiment may include the first organic insulating film 207 arranged on the inorganic insulating film 205', the second organic insulating film 208 arranged on the first organic insulating film 207, the third organic insulating film 209 arranged on the second organic insulating film 208, and the fourth organic insulating film 210 arranged between the first organic insulating film 207 and the second organic insulating film 208. As described above in FIG. 2, the second organic insulating film 208 may be regarded as a pixel-defining layer, and the third organic insulating film 209 may be regarded as a spacer. In the present example embodiment, the first organic insulating film 207 may be regarded as a first via layer and the second organic insulating film 208 may be regarded as a second via layer.

As shown in FIG. 13, the fourth organic insulating film 210 may have a fourth opening OP4 corresponding to the first opening OP1 of the first organic insulating film 207, and one end 210b of the fourth opening OP4 corresponding to the second end 207b of the first opening OP1 may also have a concavo-convex shape in a plan view.

Figure 17:
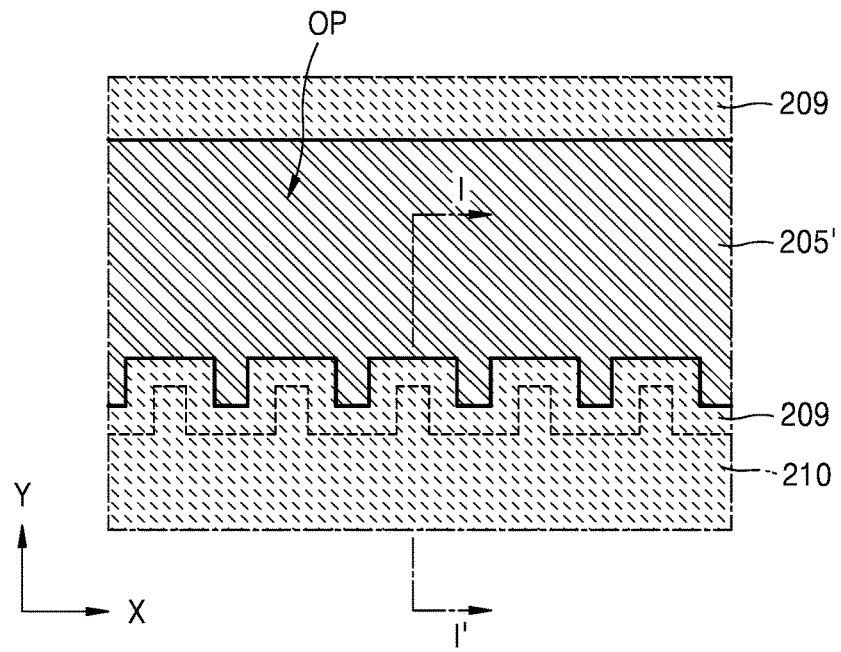
FIG. 17 is a plan view of a portion of a display device according to another example embodiment.
Figure 18:
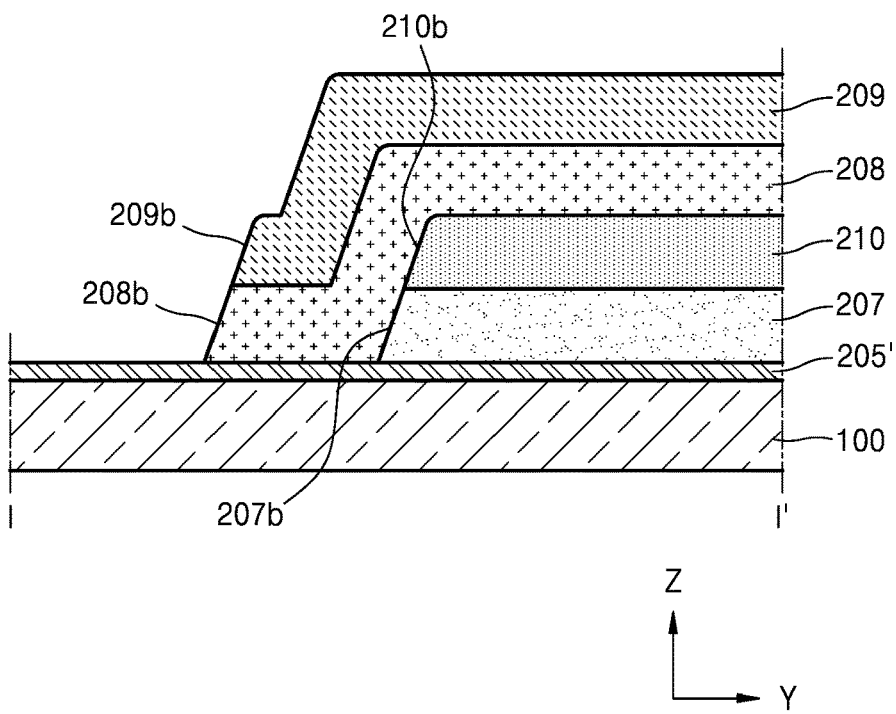
FIG. 18 is a cross-sectional view of the display device of FIG. 17, taken along a line I-I'.
Figure 19:
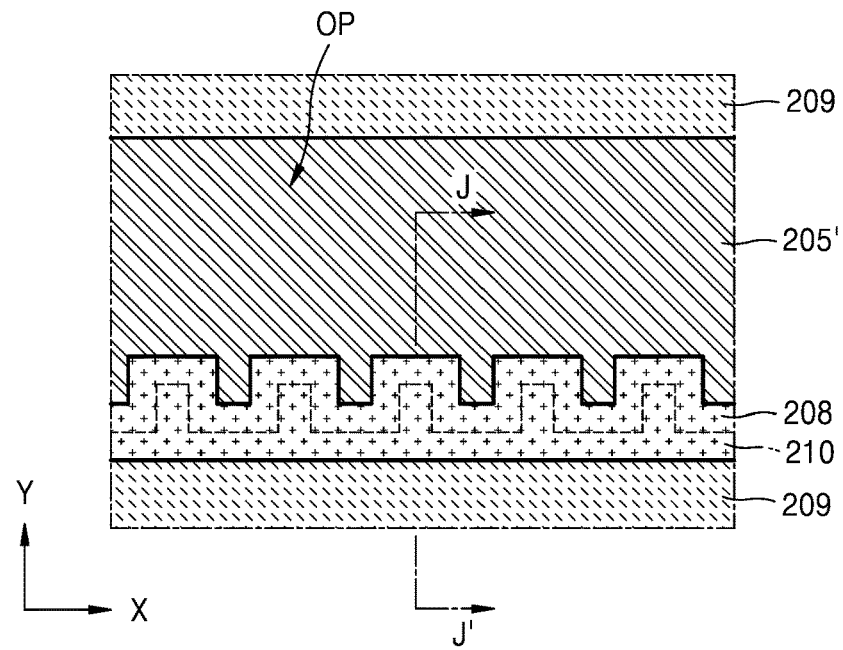
FIG. 19 is a plan view of a portion of a display device according to another example embodiment.
Figure 20:
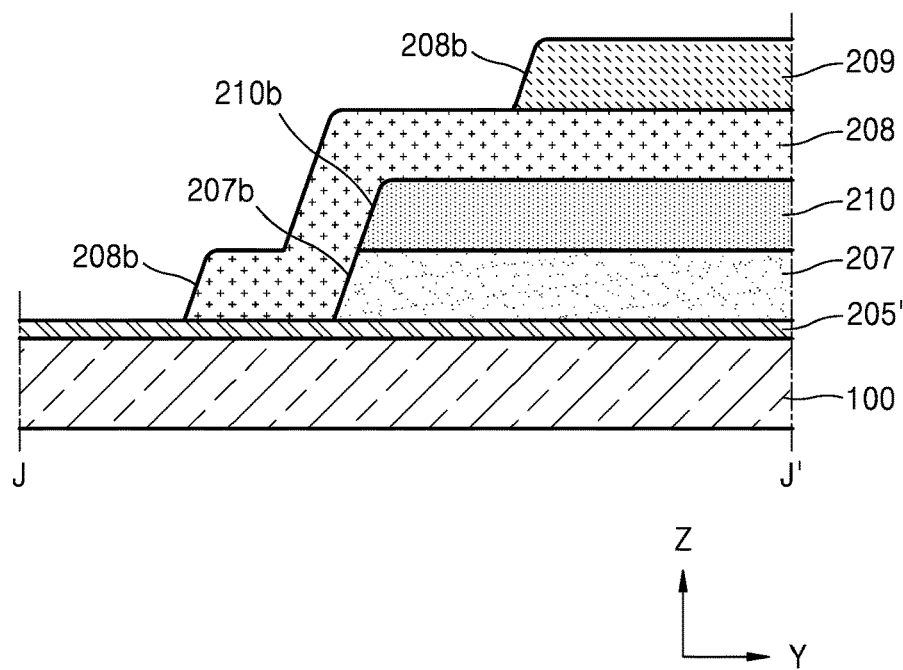
FIG. 20 is a cross-sectional view of the display device of FIG. 19, taken along a line J-J'.

In an example embodiment, such a concavo-convex shape may be formed in a shape in which a trapezoid with sloping corners is repeated, as shown in FIG. 13. In another example embodiment, such a concavo-convex shape may be formed in a shape in which a rectangle with right-angled corners is repeated, as shown in FIG. 17 or FIG. 19. The example embodiment of FIG. 17 described above differs from the example embodiment of FIG. 13 in a shape in the first plane (X-Y plane), but cross-sectional shapes thereof may be the same. Furthermore, the example embodiment of FIG. 19 differs from the example embodiment of FIG. 15 in a shape in the first plane (X-Y plane), but cross-sectional shapes may be the same.

In one or more embodiments, the second end 207b of the first organic insulating film 207 according to the present example embodiment and the one end 210b of the fourth organic insulating film 210 may coincide with each other. The third organic insulating film 209 may be provided to cover the second end 207b and the one end 210b of the fourth organic insulating film 210 corresponding to the second end 207b. Therefore, at least a portion of the third organic insulating film 209 may directly contact at least a portion of the inorganic insulating film 205' exposed by the first opening OP1. Furthermore, in the present example embodiment, the one end 209b of the third organic insulating film 209 may coincide with the one end 208b of the second organic insulating film 208. That is, the third organic insulating film 209 may be formed only on the second organic insulating film 208 so as not to cover the one end 208b of the second organic insulating film 208.

Figure 15:
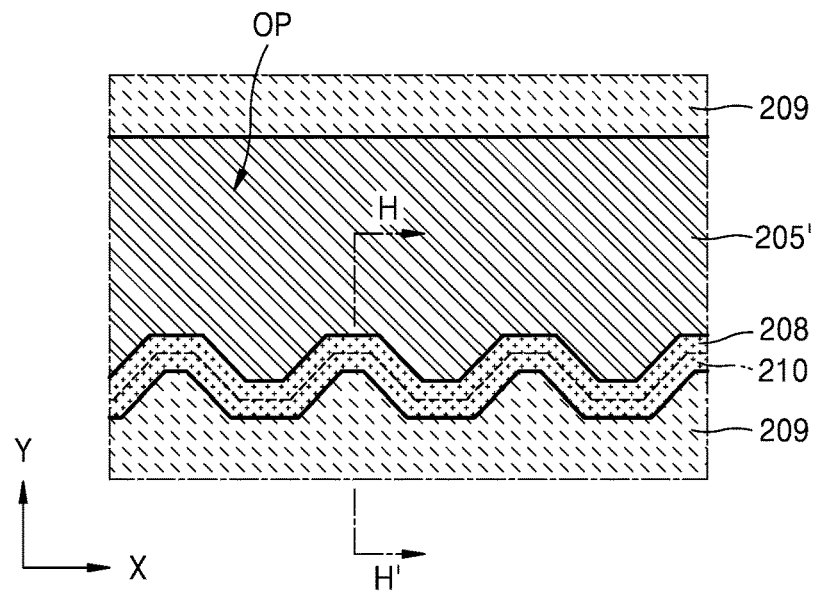
FIG. 15 is a plan view of a portion of a display device according to another example embodiment.
Figure 16:
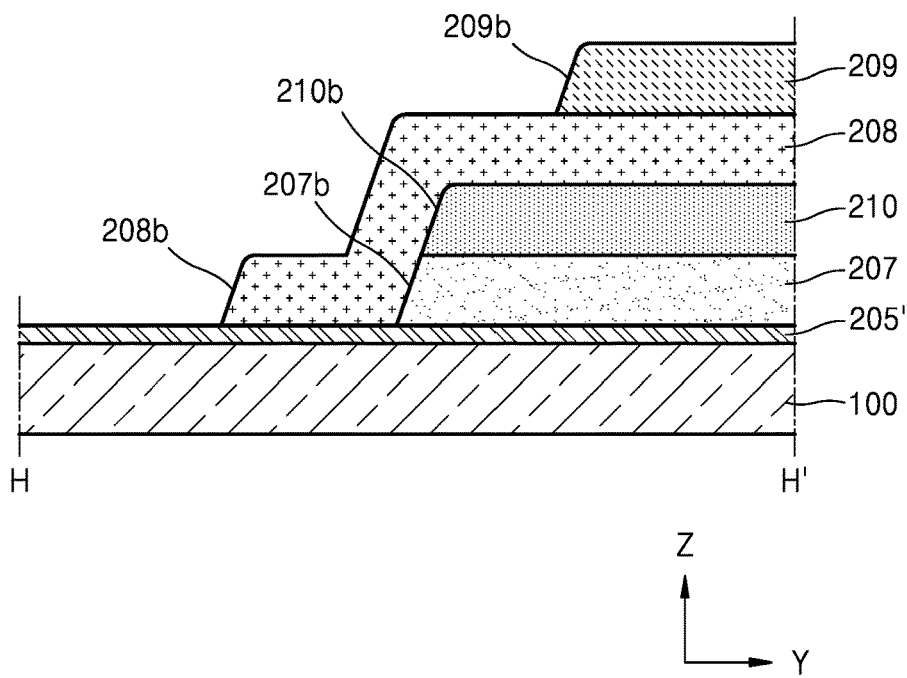
FIG. 16 is a cross-sectional view of the display device of FIG. 15, taken along a line H-H'.

Referring to FIGS. 15 and 16, in another embodiment, structures of the first organic insulating film 207, the second organic insulating film 208, and the fourth organic insulating film 210 are the same as those of FIGS. 13 and 14 described above except that the third organic insulating film 209 does not cover the one end 208b of the second organic insulating film 208, and the one end 209b of the third organic insulating film 209 and the one end 208b of the second organic insulating film 208 do not coincide with each other. Referring to FIG. 16, the one end 209b of the third organic insulating film 209 according to the present example embodiment may be arranged more inward than the second end 207b of the first organic insulating film 207. Referring to FIG. 15, the third organic insulating film 209 may have the third opening OP3, and a width of the third opening OP3 may be greater than a width of the first opening OP1.

According to an example embodiment of the present disclosure as described above, it is possible to realize a display device capable of ensuring a long life and minimizing or reducing the occurrence of defects, such as disconnection during a manufacturing process. However, the scope of the present disclosure is not limited to the above-described aspect.

It is to be understood that example embodiments described herein should be considered in a descriptive sense only and not for purposes of limitation. Descriptions of features or aspects within each example embodiment should typically be considered as available for other similar features or aspects in other example embodiments.

While some example embodiments have been described with reference to the figures, it will be understood by those of ordinary skill in the art that various changes in form and details may be made therein without departing from the spirit and scope as set forth by the following claims.

What is claimed is:

1. A display device comprising:
    a substrate comprising a display area and a non-display area outside the display area;
    a display unit arranged in the display area of the substrate;
    an inorganic insulating film arranged on the substrate over the display area and the non-display area;
    a first organic insulating film arranged on the inorganic insulating film and having a first opening extending in a first direction so as to correspond to at least a portion of the non-display area, wherein a planar shape of an end of the first opening has a concavo-convex shape; and
    an encapsulation unit arranged on the display unit to cover the display unit.

2. The display device of claim 1, wherein the first opening has a first end adjacent to the display area and extending in the first direction, and a second end facing the first end, wherein a planar shape of the second end has the concavo-convex shape.

3. The display device of claim 2, wherein the second end has a protruding portion and a recess portion arranged alternately and continuously, wherein the protruding portion or the recess portion is protruded or recessed in a second direction crossing the first direction.

4. The display device of claim 3, wherein a distance from the protruding portion to the first end is less than a distance from the recess portion to the first end.

5. The display device of claim 2, wherein the encapsulation unit is configured to cover the first end of the first opening.

6. The display device of claim 5, wherein the first opening is configured to expose a first area of the inorganic insulating film, and the encapsulation unit is configured to directly contact at least a portion of the first area.

7. The display device of claim 2, further comprising a second organic insulating film arranged on the first organic insulating film and having a second opening corresponding to the first opening, wherein a shape of an end of the second opening corresponding to a second end of the first organic insulating film defining the second end of the first opening follows a shape of the second end of the first organic insulating film.

8. The display device of claim 7, wherein the second organic insulating film is configured to cover the second end of the first organic insulating film.

9. The display device of claim 7, further comprising a third organic insulating film arranged on the second organic insulating film and having a third opening corresponding to the second opening, wherein a shape of an end of the third opening corresponding to the second end of the first organic insulating film follows the shape of the second end of the first organic insulating film.

10. The display device of claim 9, wherein an end of the third organic insulating film coincides with an end of the second organic insulating film.

11. The display device of claim 9, wherein a width of the third opening of the third organic insulating film is greater than a width of the first opening of the first organic insulating film.

12. The display device of claim 9, further comprising a fourth organic insulating film between the first organic insulating film and the second organic insulating film and having a fourth opening corresponding to the first opening.

13. The display device of claim 12, wherein an end of the fourth organic insulating film coincides with the second end of the first organic insulating film.

14. The display device of claim 12, wherein the second organic insulating film is configured to cover the second end of the first organic insulating film and an end of the fourth organic insulating film.

15. The display device of claim 12, wherein an end of the third organic insulating film coincides with an end of the second organic insulating film.

16. The display device of claim 12, wherein a width of the third opening of the third organic insulating film is greater than a width of the first opening of the first organic insulating film.

17. The display device of claim 9, wherein
the display unit comprises a thin-film transistor and a pixel electrode electrically connected to the thin-film transistor, and
the first organic insulating film is configured to cover the thin-film transistor and is between the thin-film transistor and the pixel electrode.

18. The display device of claim 17, wherein the second organic insulating film is configured to cover an edge of the pixel electrode to define a pixel area.

19. The display device of claim 2, wherein a slope of the second end is gentler than a slope of the first end.

20. A display device comprising:
a substrate comprising a display area and a non-display area outside the display area;
an inorganic insulating unit comprising at least one inorganic insulating film arranged on the substrate over the display area and the non-display area; and
an organic insulating unit arranged on the inorganic insulating unit and comprising at least one organic insulating film, and having an opening extending in a first direction so as to correspond to at least a portion of the non-display area, wherein
the opening has a first end adjacent to the display area and extending in the first direction and a second end facing the first end and spaced apart from the first end in a second direction crossing the first direction, wherein, in a plan view, the second end has a protruding portion and a recess portion arranged alternately and continuously along the first direction, the protruding portion being protruded relative to the recess portion in the second direction.

* * * * *